(12) United States Patent
Bott et al.

(10) Patent No.: US 8,520,386 B2
(45) Date of Patent: Aug. 27, 2013

(54) POWER CONVERTER MODULE WITH A COOLED BUSBAR ARRANGEMENT

(75) Inventors: Stefan Bott, Nürnberg (DE); Wilfried Kolk, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 232 days.

(21) Appl. No.: 13/133,818

(22) PCT Filed: Sep. 28, 2009

(86) PCT No.: PCT/EP2009/062480
§ 371 (c)(1),
(2), (4) Date: Jun. 9, 2011

(87) PCT Pub. No.: WO2010/066482
PCT Pub. Date: Jun. 17, 2010

(65) Prior Publication Data
US 2011/0242760 A1 Oct. 6, 2011

(30) Foreign Application Priority Data
Dec. 10, 2008 (DE) .......................... 10 2008 061 489

(51) Int. Cl.
*H05K 7/20* (2006.01)
(52) U.S. Cl.
USPC ........... 361/699; 361/707; 361/715; 165/80.4
(58) Field of Classification Search
None
See application file for complete search history.

(56) References Cited

U.S. PATENT DOCUMENTS

| | | | |
|---|---|---|---|
| 6,295,201 B1 | 9/2001 | Ogden et al. | |
| 6,604,571 B1 | 8/2003 | Morrow et al. | |
| 6,661,659 B2 * | 12/2003 | Tamba et al. | 361/699 |
| 7,453,695 B2 * | 11/2008 | Ohnishi et al. | 361/689 |
| 7,755,898 B2 * | 7/2010 | Aoki et al. | 361/710 |
| 7,760,503 B2 * | 7/2010 | Aoki et al. | 361/699 |
| 7,830,689 B2 * | 11/2010 | Nakamura et al. | 363/141 |
| 7,978,471 B2 * | 7/2011 | Tokuyama et al. | 361/699 |
| 8,072,760 B2 * | 12/2011 | Matsuo et al. | 361/707 |

FOREIGN PATENT DOCUMENTS

| | | |
|---|---|---|
| DE | 298 13 254 U1 | 10/1998 |
| DE | 199 35 803 A1 | 2/2000 |
| DE | 10 2007 003 875 A1 | 8/2008 |
| EP | 0 597 144 A1 | 5/1994 |
| JP | 2005 057108 A | 3/2005 |
| JP | 2005 354864 A1 | 12/2005 |
| JP | 2006 271063 A | 10/2006 |
| WO | WO 2005 109505 A1 | 11/2005 |
| WO | WO 2007 028039 A2 | 3/2007 |

\* cited by examiner

*Primary Examiner* — Boris Chervinsky
(74) *Attorney, Agent, or Firm* — Henry M. Feiereisen LLC

(57) ABSTRACT

A power converter module has a first liquid-cooled heat sink, a busbar arrangement having at least two busbars which are electrically insulated from one another and at least one power semiconductor module which is mechanically connected to the first liquid-cooled heat sink for thermal conduction and electrically connected to connections of the power converter module by the busbar arrangement. A second liquid-cooled heat sink is positively or non-positively connected to the busbar arrangement. A thermally conductive and electrically insulating layer is disposed between an upper busbar of the busbar arrangement and the second liquid-cooled heat sink. Additional power loss arising in the busbar is dissipated by the second liquid-cooled heat sink, which is pressed with a clamping elements on a surface of the upper busbar.

10 Claims, 2 Drawing Sheets

POWER CONVERTER MODULE WITH A COOLED BUSBAR ARRANGEMENT

CROSS-REFERENCES TO RELATED APPLICATIONS

This application is the U.S. National Stage of International Application No. PCT/EP2009/062480, filed Sep. 28, 2009, which designated the United States and has been published as International Publication No. WO 2010/066482 and which claims the priority of German Patent Application, Serial No. 10 2008 061 489.0, filed Dec. 10, 2008, pursuant to 35 U.S.C. 119(a)-(d).

BACKGROUND OF THE INVENTION

The invention relates to a power converter module with a cooled busbar arrangement.

Power converter modules of the generic type, in particular for relatively high powers, are commercially available. In the case of such power converter modules, their power semiconductor modules, in particular turn-off power semiconductor modules, are connected to connections of the power converter module by a low-inductance busbar arrangement. This is achieved by virtue of the fact that the busbars used are embodied in planar fashion and stacked one above another to form a busbar stack. An insulating layer embodied in planar fashion is arranged in each case between two planar busbars. These insulating layers project beyond the planar busbars in order that limit values for air clearances and creepage paths can be complied with. Consequently, such a low-inductance busbar arrangement has at least two busbars and at least one insulating layer. In order that the busbar arrangement of the employed power semiconductor modules of the power converter module is configured as compactly as possible, this busbar assembly is laminated. By virtue of the lamination material used, this laminated busbar arrangement has a temperature limit of 105° C., for example.

Since, in the commercially available power semiconductor modules, in particular turn-off power semiconductor modules, for example Insulated Gate Bipolar Transistor (IGBT), the current-carrying capacity continuously increases, the current density correspondingly increases in the busbars of a laminated busbar arrangement of a power converter module. This results in a quadratic increase in the losses in the laminated busbar arrangement, such that the temperature of this laminated busbar arrangement likewise increases. The limit temperature of a laminated busbar arrangement is determined by the employed materials of the insulating layers and of the lamination material. Preferably, at the present time, use is made of busbar arrangements that are laminated in power converter modules with an insulating film. In this case, the lamination material of the laminated busbar arrangement sets a temperature limit. For power converter applications, this means a power limitation which is no longer governed by the power semiconductor modules used, but rather by the maximum limit temperature of the corresponding lamination material of the busbar arrangement.

Obvious solutions to this problem include, firstly, increasing the cross section of each busbar of the laminated busbar arrangement, and, secondly, cooling the laminated busbar arrangement, for example by inherent convection. By increasing the cross sections of the busbars of the laminated busbar arrangement, such a busbar arrangement not only is more costly, but also has a higher weight. In order to cool the laminated busbar arrangement by inherent convection, it has to be arranged in a power converter apparatus in such a way that a cooling air stream can flow over the laminated busbar arrangement.

WO 2005/109505 A1 discloses a power semiconductor circuit whose busbar arrangement is cooled. In the case of this power semiconductor circuit, at least one module is soldered on the outer side on a plate-type busbar serving as positive or negative plate. The positive and negative busbars are usually arranged as topmost and bottommost plates, respectively, on a plate busbar assembly. This top busbar, on which the module is applied, is cooled directly by a cooling device, wherein this cooling device is embodied as air or liquid cooling. This cooling device is arranged in a sandwich-like manner between the top busbar and, with the interposition of an insulation, a further plate-type busbar lying in a parallel plane. Furthermore, a busbar on the underside is provided with the interposition of a further insulating layer. These busbars form together with the cooling device a very compact arrangement.

The elements of this busbar assembly are connected to one another by lamination. Since this power semiconductor circuit is an inverter, two intermediate circuit capacitors are arranged below this busbar assembly, these capacitors being connected to the upper and lower busbars, respectively, by means of screw connections.

DE 10 2007 003 875 A1 discloses a power converter module comprising at least two power semiconductor modules which are mechanically connected to a cooling body in a thermally conductive manner and are electrically interconnected by means of a laminated busbar arrangement. At least one busbar of this laminated busbar arrangement is thermally linked to the cooling body by means of at least one electrically insulating and thermally conductive supporting element. By means of these supporting elements, at least one busbar of the laminated busbar arrangement is thermally linked to the cooling body. The magnitude of the heat to be dissipated determines the number of thermally conductive supporting elements. By means of these supporting elements, the laminated busbar arrangement is likewise supported in the edge regions. The quantity of heat to be dissipated from the laminated busbar arrangement is restricted by means of these thermally conductive supporting elements.

The invention is based on the object, then, of specifying a power converter module, from the laminated busbar arrangement of which heat can be dissipated using simple means, wherein this power converter module does not have to be rerouted or redesigned.

SUMMARY OF THE INVENTION

This object is achieved according to the invention by a power converter module having a first liquid-cooled heat sink, a busbar arrangement having at least two busbars which are electrically insulated from one another, at least one power semiconductor module which is mechanically connected to the first liquid-cooled heat sink for thermal conduction and electrically connected to connections of the power converter module by the busbar arrangement, and a second liquid-cooled heat sink positively or non-positively connected to the busbar arrangement. A thermally conductive and electrically insulating layer is disposed between an upper busbar of the busbar arrangement and the second liquid-cooled heat sink.

By virtue of the fact that a further liquid-cooled heat sink is connected to the busbar arrangement of a power converter module in a force-locking and/or positively locking manner thermally conductively, but in an electrically insulating manner, heat can be dissipated from this busbar arrangement over a large area. If the base area of the further liquid-cooled heat sink is not sufficient, then the flow rate can additionally be increased. How well the busbar arrangement and further liquid-cooled heat sink are thermally connected is dependent on the contact pressure with which this further liquid-cooled heat sink is pressed onto the busbar arrangement. For this purpose, the power converter module according to the invention has at least one clamping element.

In one advantageous embodiment of the power converter module according to the invention, the further liquid-cooled heat sink and the liquid-cooled heat sink of the power converter module are linked to one another for fluid conduction. That is to say that the further liquid-cooled heat sink is supplied from the liquid circuit of the power converter module, which is also designated as the primary circuit. This has the advantage that the power converter module remains unchanged in terms of its connections.

BRIEF DESCRIPTION OF THE DRAWING

For further elucidation of the invention, reference is made to the drawing which schematically illustrates an embodiment.

FIG. 2 illustrates a first embodiment of a clamping element of the power converter module according to FIG. 1, wherein

DETAILED DESCRIPTION OF PREFERRED EMBODIMENTS

Figure 1:
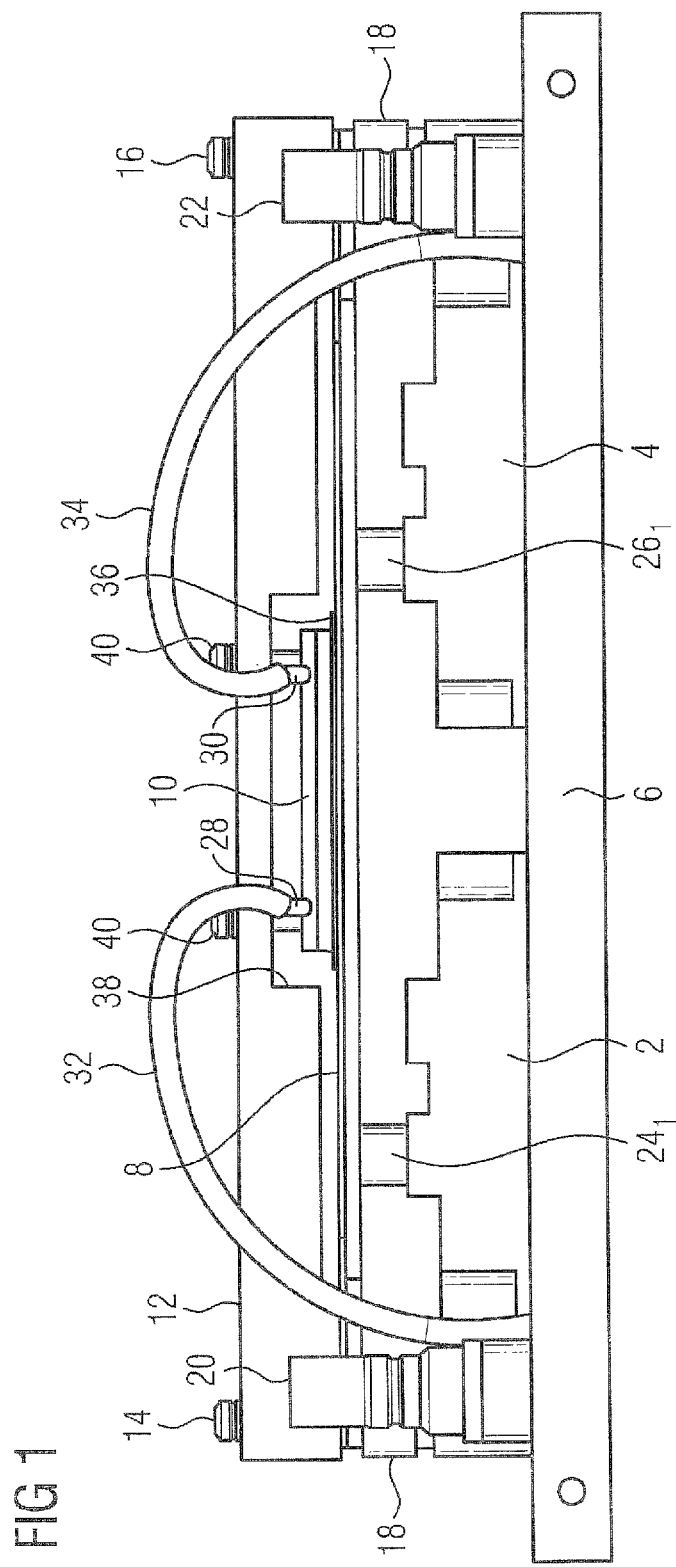
FIG. 1 shows an advantageous embodiment of a power converter module according to the invention.

In FIG. 1, which illustrates a front view of a power converter module according to the invention, 2 and 4 in each case designate a power semiconductor module, in particular a turn-off power semiconductor module, for example an insulated gate bipolar transistor (IGBT), 6 designates a liquid-cooled heat sink, 8 designates a busbar arrangement, 10 designates a further liquid-cooled heat sink, 12 designates a clip, 14 and 16 in each case designate a clamping screw, and 18 designates supporting elements. In addition, a coolant inlet and outlet are designated by 20 and 22 in this illustration.

The two power semiconductor modules 2 and 4 are mechanically fixed to the liquid-cooled heat sink 6 in a releasable manner. The busbar arrangement 8, which in particular is laminated, can have two busbars, for example one positive busbar and one load busbar or one load busbar and one negative busbar, or three busbars, for example one positive, load and negative busbar. The number of busbars of the busbar arrangement 8 is dependent on the electrical interconnection of the two power semiconductor modules 2 and 4. If these two power semiconductor modules 2 and 4 are electrically connected in parallel, then the busbar arrangement 8 only has two busbars. By contrast, if these two power semiconductor modules 2 and 4 are electrically connected in series and form a phase module of a power converter, then this busbar arrangement 8 has three busbars. If the power converter module is used as a phase module, then the three busbars of the busbar arrangement 8 provided are one positive, load and negative busbar. These busbars are arranged one above another, wherein an insulating layer is arranged in each case between two busbars, and in particular laminated.

This busbar arrangement 8 is placed on the electrical connections of each power semiconductor module 2 and 4, only one connection $24_1$ and $26_1$ of the two power connections in each case being illustrated. These electrical connections $24_1$ and $26_1$ can be soldering pins or threaded bolts. Starting from a predetermined power capacity of the power semiconductor module 2, 4, the power semiconductor modules 2, 4 have as electrical connections 24 and 26 only threaded bolts. In accordance with the interconnection of the two power semiconductor modules 2, 4, the connections 24, 26 thereof are in each case electrically conductively connected to a predetermined busbar of the busbar arrangement 8. This busbar arrangement 8 is supported not only on the connections 24, 26 of the power semiconductor modules 2, 4, but also on a plurality of supporting elements 18. The latter are arranged along a respective longitudinal side of the power converter module.

Since a liquid-cooled heat sink 6 is provided as the cooling body of this power converter module, this liquid-cooled heat sink has a coolant inlet 20 and a coolant outlet 22. With this coolant inlet and outlet 20 and 22, the power converter module is fluidly connected to a coolant circuit. Any liquid, preferably a water-glycol mixture, can be used as the cooling liquid.

Since the current-carrying capacity of the power semiconductor modules 2, 4 used in the power converter module continuously increases, the current in the busbars of the busbar arrangement 8 also rises. This results in a quadratic increase in the losses in the busbar arrangement 8. As a result, the temperature in the busbar arrangement 8 rises. The possible magnitude of the limit temperature at the busbar arrangement 8 is dependent on the insulating material used. That is to say that, in the case of a laminated busbar arrangement 8, the lamination material of this busbar arrangement 8 fixes a temperature limit. That means for power converter applications a power limitation which is no longer determined by the power semiconductor modules 2, 4 used, but rather by the material-specific limit temperature of an insulating material.

In order to be able to dissipate the power loss produced in the busbar arrangement 8, this busbar arrangement 8 is provided with a further liquid-cooled heat sink 10. The coolant inlet and outlet 28 and 30 of this further liquid-cooled heat sink 10 are respectively connected in terms of coolant to the liquid circuit of the liquid-cooled heat sink 6 by means of a connecting hose 32 and 34. The liquid circuit of the liquid-cooled heat sink 6 is designated as the primary circuit, and the liquid circuit of the further liquid-cooled heat sink 10 is designated as the secondary circuit. The primary and secondary circuits can be fluidly connected in parallel or in series. Contrary to the illustration, this further liquid-cooled heat sink 10 can cover approximately the entire surface of the busbar arrangement 8. In order that this further liquid-cooled heat sink 10 is electrically insulated from this busbar arrangement 8, an insulating layer 36 is provided, which, however, has to have good thermal conductivity. In the simplest case, this insulating layer 36 can be produced by means of a thermally conductive paste. In order that a heat transfer is efficient, the further liquid-cooled heat sink 10 is connected to the busbar arrangement 8 in a force-locking and/or positively locking manner.

Figure 2:
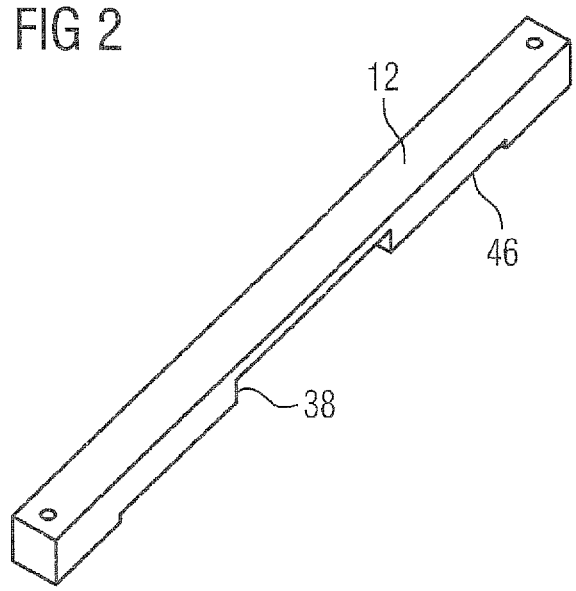

At least one clamping element is required for producing a force-locking and/or positively locking connection. If a plurality of clamping elements are provided, then they are arranged in a manner distributed in the longitudinal direction of the further liquid-cooled heat sink 10. In the embodiment illustrated, a clip (12) (FIG. 2) with two clamping screws 14 and 16 is provided as the clamping element. This clip 12 in accordance with FIG. 2 has a configured cutout 38 corresponding to the dimensions of the further liquid-cooled heat sink 10. In order to be able to set the contact pressure of the further liquid-cooled heat sink 10 on the busbar arrangement 8, the clip 12 has at least two pressure elements 40. Rotation of this pressure elements 40 increases a pressure on the further liquid-cooled heat sink 10 and thus on a corresponding surface of the busbar arrangement 8.

Figure 3:
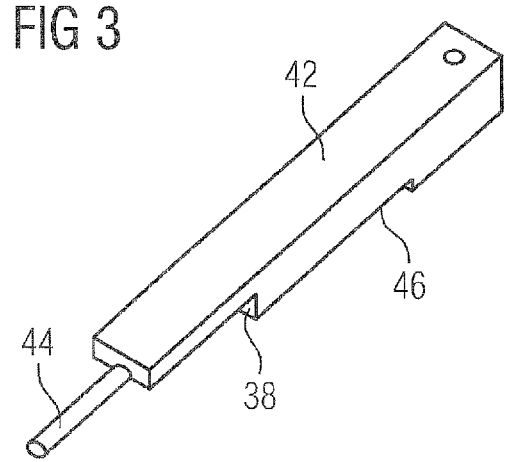
FIG. 3 shows part of a second embodiment of a clamping element of the power converter module according to FIG. 1.

Alternative embodiments of a clamping element are a leaf spring or a clip 42 with an elastic intermediate part 44 (FIG. 3). The clip 12 in accordance with FIG. 2 also has, alongside the cutout 38 for the further liquid-cooled heat sink 10, a further cutout 46 in order thereby to be able to be adapted to the course of the surface of the laminated busbar arrangement 8. If no additional pressure elements 40 are intended to be used on the clip 12, the cutout 38 has to be configured such that in the mounted state of the clip 12, along the further liquid-cooled heat sink 10, a predetermined contact pressure is exerted. In accordance with the embodiment of the clip 42 in accordance with FIG. 3, this clip 42 has in the center an elastic intermediate element 44, which, in the mounted state of the clip 42, exerts a press-on force on the further liquid-cooled heat sink 10.

By means of this further liquid-cooled heat sink 10, which is pressed by means of at least one clamping element onto a surface of a busbar arrangement 8, in particular of a laminated busbar arrangement 8, of a power converter module, it is possible to dissipate an additional power loss produced in the laminated busbar arrangement 8. As a result, the temperature of the busbar arrangement is reduced, as a result of which the power semiconductor modules 2, 4 used can be fully utilized in terms of power. That is to say that the power converter module has a higher power, without the electrical connections and liquid connections of the power converter module having to be altered. The assembly and disassembly sequence of the power converter module is maintained as a result. Since, moreover, a required liquid flow for the secondary circuit has only a fraction of the primary circuit, the structural construction of the power converter module is maintained.

What is claimed is:

1. A power converter module comprising:
   a first liquid-cooled heat sink;
   a busbar arrangement having at least two busbars which are electrically insulated from one another;
   at least one power semiconductor module which is mechanically connected to the first liquid-cooled heat sink for thermal conduction and electrically connected by the busbar arrangement to connections of the power converter module;
   a second liquid-cooled heat sink positively or non-positively connected to the busbar arrangement; and
   a thermally conductive and electrically insulating layer disposed between an upper busbar of the busbar arrangement and the second liquid-cooled heat sink.

2. The power converter module of claim 1, further comprising at least one clamping element for positively or non-positively connecting the second liquid-cooled heat sink to the busbar arrangement.

3. The power converter module of claim 1, wherein the second liquid-cooled heat sink is fluidly connected to the first liquid-cooled heat sink.

4. The power converter module of claim 1, wherein the second liquid-cooled heat sink covers at least approximately a major portion of a surface area of the busbar arrangement.

5. The power converter module of claim 2, wherein the clamping element comprises a leaf spring with two clamping screws.

6. The power converter module of claim 2, wherein the clamping element comprises a positive-locking bracket with two clamping screws.

7. The power converter module of claim 6, wherein the positive-locking bracket comprises an elastic part disposed in a region of the second liquid-cooled heat sink.

8. The power converter module of claim 1, wherein the insulating layer comprises a thermally conductive interlace materials.

9. The power converter module of claim 1, wherein the insulating layer comprises thermally conductive and electrically insulating interface materials.

10. The power converter module of claim 1, wherein the busbars and the insulating layer are laminated with one another.

* * * * *